(12) United States Patent (10) Patent No.: US 8,576,012 B2
Chen (45) Date of Patent: Nov. 5, 2013

(54) SINGLE-TO-DIFFERENTIAL CONVERSION CIRCUIT

(75) Inventor: Hsien-Ku Chen, Taoyuan County (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/435,829

(22) Filed: Mar. 30, 2012

(65) Prior Publication Data

US 2012/0249186 A1    Oct. 4, 2012

(30) Foreign Application Priority Data

Apr. 1, 2011  (TW) .............................. 100111572 A (51) Int. Cl.
 *H03F 3/04* (2006.01)
(52) U.S. Cl.
 USPC ........................................................ 330/301
(58) Field of Classification Search
 USPC ......................................... 330/116, 117, 301
 See application file for complete search history.

(56) References Cited

U.S. PATENT DOCUMENTS

| 6,608,527 B2 * | 8/2003 | Moloudi et al. | ............... | 330/301 |
| 7,671,685 B2 * | 3/2010 | Chang | ........................... | 330/301 |

* cited by examiner

*Primary Examiner* — Khanh V Nguyen
(74) *Attorney, Agent, or Firm* — Osha Liang LLP (57) ABSTRACT

A single-to-differential conversion circuit includes a first transistor, a second transistor, and a transforming unit. Each of the first and second transistors has first, second and third terminals. The transforming unit has first, second, and third induction elements. The first induction element has a first inductive terminal coupled to the second terminal of the first transistor, and a second inductive terminal coupled to a voltage source. The second induction element has a first inductive terminal to be coupled to the voltage source, and a second inductive terminal coupled to the second terminal of the second transistor. The third induction element has a first inductive terminal coupled to the first terminals of the first and second transistors, and a second inductive terminal coupled to ground. The third induction element electrically couples to the first and the second induction elements according to first and second coupling parameters, respectively.

15 Claims, 5 Drawing Sheets

SINGLE-TO-DIFFERENTIAL CONVERSION CIRCUIT

CROSS-REFERENCE TO RELATED APPLICATION

This application claims priority to Taiwanese Patent Application No. 100111572, filed on Apr. 1, 2011, the disclosure of which is incorporated herein by reference.

BACKGROUND OF THE INVENTION

1. Field of the Invention

The invention relates to a single-to-differential conversion circuit, more particularly to a single-to-differential conversion circuit with gain compensation.

2. Description of the Related Art

In a telecommunication system, the receiver usually needs to use a single-to-differential conversion circuit to convert a received radio frequency (RF) signal into a differential signal having a first differential voltage and a second differential voltage. Under ideal conditions, the first and second differential voltages should be the same in magnitude, and 180° out of phase.

Figure 1:
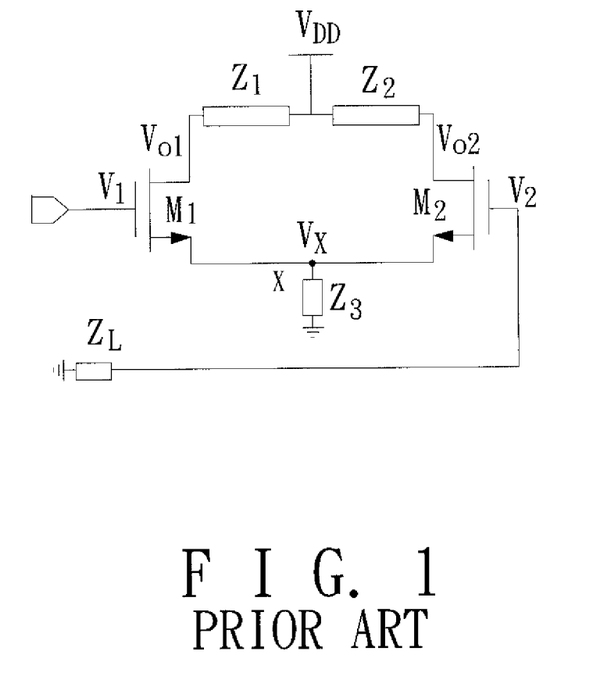
FIG. 1 is a circuit diagram of a conventional single-to-differential conversion circuit.
Figure 2:
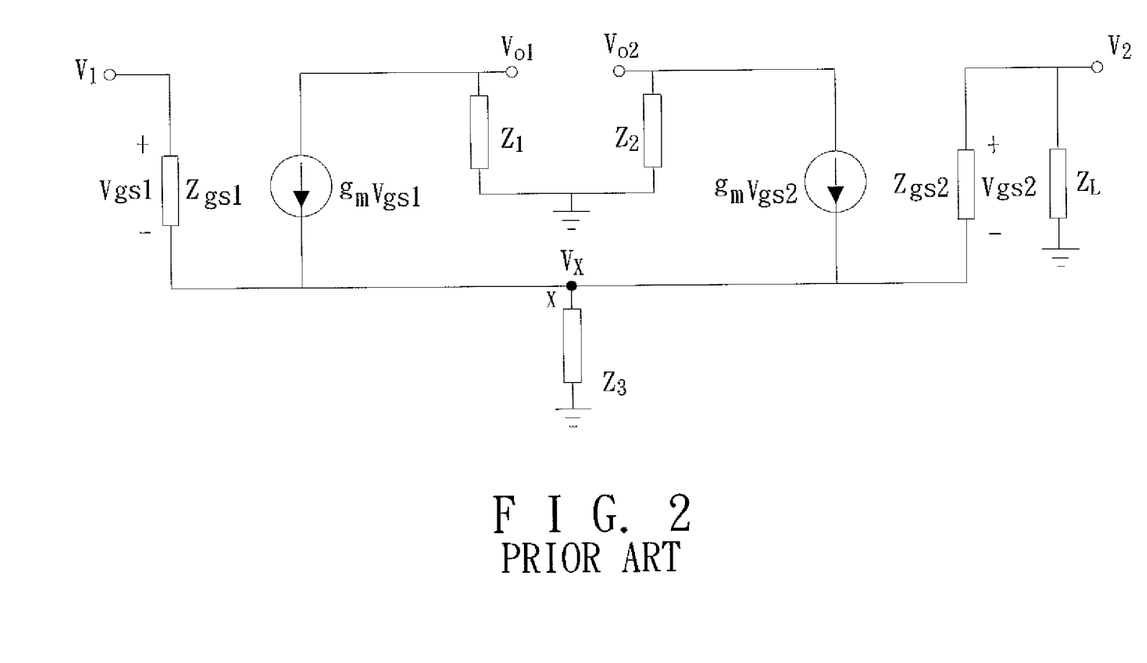
FIG. 2 is a small signal model diagram of the conventional single-to-differential conversion circuit.

Looking at the current technology of the related circuit and the small signal model for a single-to-differential conversion circuit as shown in FIGS. 1 and 2, a simple description is provided as follows:

After a first transistor $M_1$ receives a RF signal, under ideal conditions and when the equivalent impedances $Z_{gs1}, Z_{gs2}, Z_3$ (where $Z_{gs1}$ is the equivalent impedance between the gate and source of the first transistor $M_1$, $Z_{gs2}$ is the equivalent impedance between the gate and source of a second transistor $M_2$, and $Z_3$ is a third equivalent impedance) are sufficiently large in magnitude (or the equivalent impedances $Z_{gs1}, Z_{gs2}$, and $Z_3$ approach positive infinity), and when the load equivalent impedance $Z_L$ is sufficiently small in magnitude, the single-to-differential conversion circuit can output a first differential voltage $V_{o1}$ and a second differential voltage $V_{o2}$ as follows:

$$V_{o1} = -g_m\left(\frac{V_1}{2}\right)Z_1$$

$$V_{o1} = g_m\left(\frac{V_1}{2}\right)Z_2$$

Where $Z_1$ is a first equivalent impedance, $Z_2$ is a second equivalent impedance, $V_1$ is an input voltage, and $g_m$ is a transconductance coefficient of the first transistor $M_1$ (or the second transistor $M_2$). In the implementations of the current technology, the first and second equivalent impedances $Z_1, Z_2$ are implemented by resistors, and the third equivalent impedance $Z_3$ is implemented by resistors or transistors.

Therefore, under ideal conditions, when the first equivalent impedance $Z_1$ is equal to the second equivalent impedance $Z_2$, the single-to-differential conversion circuit will output a group of differential voltages including the first differential voltage $V_{o1}$ and the second differential voltage $V_{o2}$. When the first differential voltage $V_{o1}$ and the second differential voltage $V_{o2}$ are equal, the phase difference is 180°.

However, during the operation of the single-to-differential conversion circuit described above, the input voltage $V_1$ is usually attenuated when transmitted to a node X because the equivalent impedance $Z_{gs1}$ between the gate and the source of the first transistor $M_1$, the equivalent impedance $Z_{gs2}$ between the gate and the source of the second transistor $M_2$, and/or the third equivalent impedance $Z_3$ are not large enough. The magnitude of the voltage $V_x$ at the node X is thus smaller than half the input voltage $V_1$, and the gate-source voltage $V_{gs1}$ of the first transistor $M_1$ is therefore not equal to the gate-source voltage $V_{gs2}$ of the second transistor $M_2$. The gain mismatch of the first and second differential voltages $V_{o1}, V_{o2}$ in the set of differential signals will result in unbalanced set of differential signals. Therefore, it is worth looking into efficiently solving the gain mismatch problem when designing the receiver circuit of a telecommunication system.

SUMMARY OF THE INVENTION

Therefore, an object of the present invention is to provide a single-to-differential conversion circuit with gain compensation.

According to one embodiment of the present invention, a single-to-differential conversion circuit of the present invention comprises a first transistor, a second transistor, and a transforming unit. Both of the first and second transistors has a first terminal, a second terminal, and a third terminal. The third terminal of the first transistor receives an input signal.

The transforming unit has a first induction element, a second induction element, and a third induction element. The first induction element has a first inductive terminal coupled to the second terminal of the first transistor, and a second inductive terminal to be coupled to a voltage source. The second induction element has a first inductive terminal to be coupled to the voltage source, and a second inductive terminal coupled to the second terminal of the second transistor. The third induction element has a first inductive terminal coupled to the first terminal of the first transistor and the first terminal of the second transistor, and a second inductive terminal to be coupled to ground.

The first induction element and the third induction element undergo a first electrical coupling according to a first coupling parameter. The second induction element and the third induction element undergo a second electrical coupling according to a second coupling parameter.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 3:
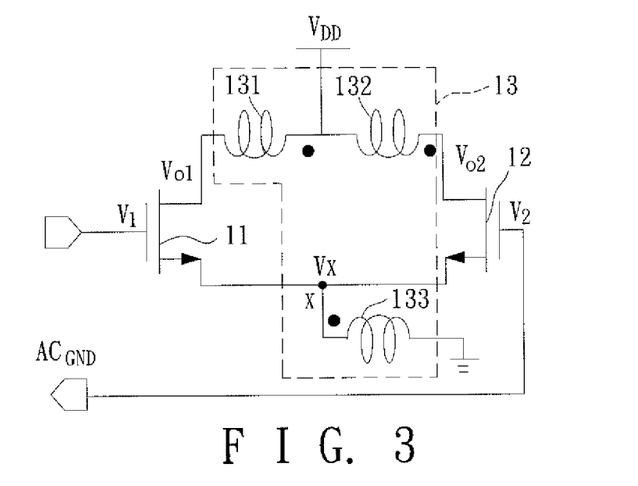
FIG. 3 is a circuit diagram of the preferred embodiment of the single-to-differential conversion circuit of the present invention.

FIG. 3 shows the preferred embodiment of a single-to-differential conversion circuit of the present invention that comprises a first transistor 11, a second transistor 12, and a transforming unit 13.

The first transistor 11 has a first terminal, a second terminal, and a third terminal which receives an input signal. The second transistor 12 has a first terminal, a second terminal and a third terminal. In the present embodiment, the first and second transistors 11, 12 are both N-type metal oxide semiconductor-field effect transistors. The first terminals of both first and second transistors 11, 12 are source terminals. The second terminals of both first and second transistors 11, 12 are drain terminals. The third terminals of both first and second transistors 11, 12 are gate terminals.

The transforming unit 13 has a first induction element 131, a second induction element 132 and a third induction element 133. The first induction element 131 has a first inductive terminal electrically coupled to the second terminal of the first transistor 11, and a second inductive terminal electrically coupled to a voltage source $V_{DD}$. The second induction element 132 has a first inductive terminal electrically coupled to the voltage source $V_{DD}$, and a second inductive terminal electrically coupled the second terminal of the second transistor 12. The third induction element 133 has a first inductive terminal electrically coupled to the first terminal of the first transistor 11 and the first terminal of the second transistor 12 (this connection node is referred to as node X), and a second inductive terminal electrically coupled to a ground terminal. The first induction element 131 and the third induction element 133 undergo a first electrical coupling according to a coupling parameter. The second induction element 132 and the third induction element 133 undergo a second electrical coupling according to the coupling parameter.

Figure 4:
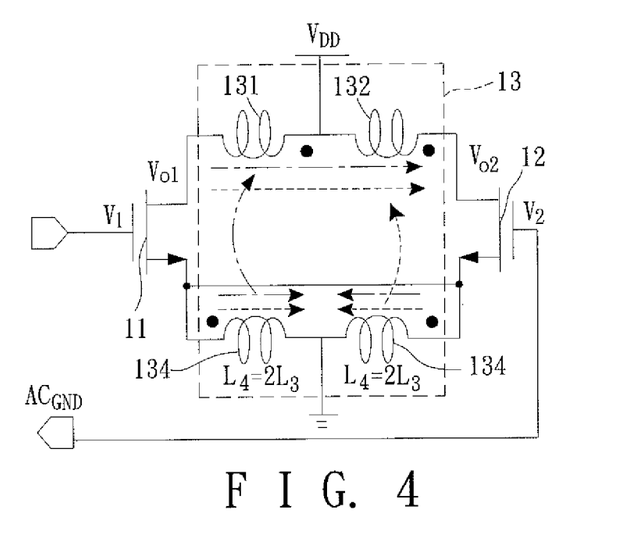
FIG. 4 is an equivalent circuit diagram of the preferred embodiment.

For simplicity, FIG. 4 is the equivalent circuit diagram of FIG. 3. Two fourth induction elements 134 are the equivalence of the third induction element 133 and the two fourth induction elements 134 are electrically coupled in series. Every fourth induction element 134 has an inductance value $L_4$ twice that of the inductance value $L_3$ of the third induction element 133 ($L_4 = 2 \times L_3$).

The following description refers to FIG. 4 and describes the relevant theoretical foundation of the preferred embodiment of the present invention.

With the preferred embodiment operating at a first cycle (the positive half cycle of the input signal), because an alternating current flows via the fourth induction elements 134, according to the coupling relationship of the transforming unit 13, there is created a first induction current $I_k$ at the first and second induction elements 131, 132, and the current direction is flowing out of the first induction element 131, calculated by:

$$I_k = I_4 \cdot K \cdot \sqrt{\frac{2L_3}{L_0}}$$

wherein $I_4$ is the current flowing through the fourth induction elements 134, K is the coupling coefficient, and $L_0 = L_1 = L_2$, which means the first and second induction elements 131, 132 have the inductance values $L_1$, $L_2$ respectively, that are equal to each other.

When the preferred embodiment is operating at a second cycle (the negative half cycle of the input signal), there is created a second induction current $I_k'$ at the first and second induction elements 131, 132, where the second induction current $I_k'$ is equal to the first induction current $I_k$. The current direction of the second induction current $I_k'$ is flowing into the second induction element 132.

From the above, assuming the first transistor 11 has the third terminal voltage $V_1 = V_{IN}$, and the second transistor 12 has the third terminal voltage $V_2 = 0$, a first differential voltage $V_{o1}$ (from the first terminal of the first induction element) and a second differential voltage $V_{o2}$ (from the second terminal of the second induction element) can be calculated as follows:

$$V_{o1} = -(g_{m1}V_{gs1} - I_k)Z_{L1}$$
$$= -\left(g_{m1}V_{gs1} - I_4 \cdot K \cdot \sqrt{\frac{2L_3}{L_0}}\right)Z_{L0}$$
$$= -\left[g_{m1}(V_{IN} - V_X) - I_4 \cdot K \cdot \sqrt{\frac{2L_3}{L_0}}\right]Z_{L0}$$

$$V_{o2} = -(g_{m2}V_{gs2} + I_k)Z_{L2}$$
$$= -\left(g_{m2}V_{gs2} + I_4 \cdot K \cdot \sqrt{\frac{2L_3}{L_0}}\right)Z_{L0}$$
$$= -\left[g_{m2}(-V_X) + I_4 \cdot K \cdot \sqrt{\frac{2L_3}{L_0}}\right]Z_{L0}$$

where $g_{m1}$, $g_{m2}$ are the transconductance coefficients of the first and second transistors 11, 12, respectively. $V_{gs1}$ is the voltage between the third and first terminals of the first transistor 11. $V_{gs2}$ is the voltage between the third and first terminals of the second transistor 12. $I_k$ is the first inductive current. $Z_{L1}/Z_{L2}$ are the equivalent impedances of the first and second induction elements 131, 132, and $Z_{L1} = Z_{L2} = Z_{L0}$. $V_X$ is the voltage at the node X.

Assuming $g_{m1} = g_{m2} = g_m$, then the voltage $V_X$ at the node X is as follows:

$$V_X = \frac{(g_m + Y_{gs1}) \cdot Z_{L3}}{1 + (2g_m + Y_{gs1} + Y_{gs2}) \cdot Z_{L3}} \cdot V_{IN} = A \cdot V_{IN}$$

and the current $I_4$ flowing through the fourth induction elements 134 is as follows:

$$I_4 = g_m(V_{IN}) + (V_{IN} - AV_{IN})Y_{gs1} + (-AV_{IN})Y_{gs2}$$
$$= [g_m + (1 - A)Y_{gs1} + (-A)Y_{gs2}]V_{IN}$$

where $Y_{gs1}$ is the equivalent reactance between the third terminal and the first terminal of the first transistor 11. $Y_{gs2}$ is the equivalent reactance between the third terminal and the first terminal of the second transistor 12. $Z_{L3}$ is the equivalent impedance of the third induction element 133. A is a matching coefficient.

Therefore, according to the above equations, the relationship of the first and second differential voltages $V_{o1}$, $V_{o2}$ to the input voltage $V_{IN}$ can be obtained as follows:

$$\frac{V_{o1}}{V_{IN}} = -\left\{g_m(1 - A) - [g_m + (1 - A)Y_{gs1} + (-A)Y_{gs2}] \cdot K \cdot \sqrt{\frac{2L_3}{L_0}}\right\}Z_{L0}$$

$$\frac{V_{o2}}{V_{IN}} = -\left\{g_m(-A) + [g_m + (1 - A)Y_{gs1} + (-A)Y_{gs2}] \cdot K \cdot \sqrt{\frac{2L_3}{L_0}}\right\}Z_{L0}$$

According to the above description, when there is a gain mismatch in the single-to-differential conversion circuit of the preferred embodiment (i.e., the equivalent impedance $Z_{gs1}$ between the third and first terminals of the first transistor 11, the equivalent impedance $Z_{gs2}$ between the third and first terminals of the second transistors 12, and/or the equivalent impedance $Z_{L3}$ of the third induction element 133 are not big enough in magnitude), the matching coefficient A will have a value less than 0.5. If the first to third induction elements 131-133 do not electrically couple (i.e., the coupling coefficient K is 0), then $$\left|\frac{V_{o1}}{V_{IN}}\right| > \left|\frac{V_{o2}}{V_{IN}}\right|$$

Therefore, the first differential voltage $V_{o1}$ and the second differential voltage $V_{o2}$ will not balance.

If during the design, the coupling coefficient K of the transforming unit 13 is $$K = \frac{g_m}{2[g_m + (1-A)Y_{gs1} + (-A)Y_{gs2}] \cdot \sqrt{\frac{2L_3}{L_0}}},$$

the first electrical coupling can decrease the absolute value of the first differential voltage $V_{o1}$, and the second electrical coupling can increase the absolute value of the second differential voltage $V_{o2}$. The first differential voltage $V_{o1}$ and the second differential voltage $V_{o2}$ are then equal in magnitude (i.e., the absolute value of both first and second differential voltages $V_{o1}$, $V_{o2}$ are equal), and 180° out of phase.

Therefore, the coupling coefficient K of the transforming unit 13 can be used to compensate the gain mismatch of the single-to-differential conversion circuit. There may be some variance during circuit operations and differences in the circuit components. The transconductance coefficient $g_{m1}$ of the first transistor 11 may not be equal to the transconductance coefficient $g_{m2}$ of the second transistor 12, the inductance $L_1$ of the first induction element 131 may not be equal to the inductance $L_2$ of the second induction element 132, and the first and second coupling parameters between the first and second induction elements 131, 132 and the third induction element 133 and the related electrical couplings may be different. However, the present embodiment discloses the method to compensate the gain mismatch problem in the single-to-differential conversion circuit.

Figure 5:
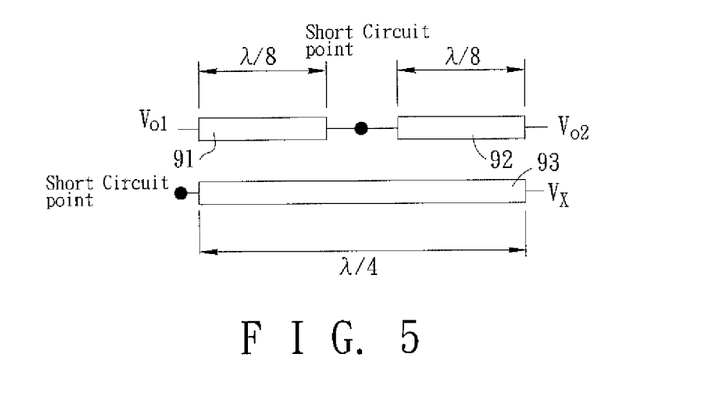
FIG. 5 is an alternative implementation of a transforming unit of the preferred embodiment.

According to the foundation of the above description, if the present embodiment is to be applied to a high frequency situation, for example, anti-collision radar for cars (approximately operating at 77 GHz), an embodiment of the transforming unit 13 of the single-to-differential conversion circuit is shown in FIG. 5, which uses a transmission line model.

Referring to both FIGS. 3 and 5, a first transmission line section 91 replaces the first induction element 131, a second transmission line section 92 replaces the second induction element 132, and a third transmission line section 93 replaces the third induction element 133. The lengths of the first and second transmission line sections 91, 92 are one eight of the wavelength of the input signal (λ/8). The length of the third transmission line section 93 is one quarter of the wavelength of the input frequency (λ/4). The coupling effect of the first, second and third transmission line sections 91, 92 and 93 can compensate the gain mismatching problem in the single-to-differential conversion circuit.

Figure 6:
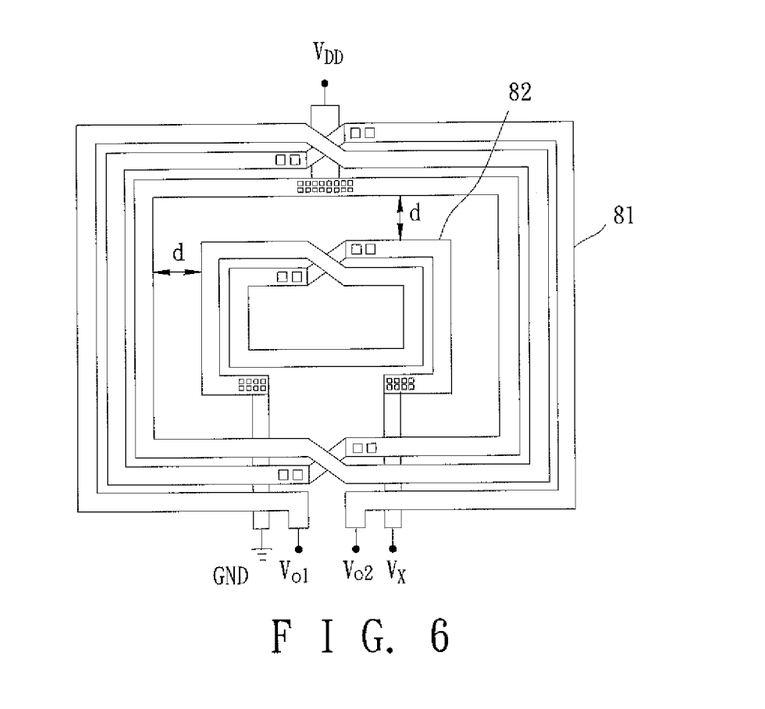
FIG. 6 is another alternative implementation of the transforming unit of the preferred embodiment.

If the present embodiment is to be applied to a mid-to-low frequency situation, an embodiment of the transforming unit 13 of the single-to-differential conversion circuit is shown in FIG. 6, which uses a transformer model.

Referring to both FIGS. 3 and 6, a first loop unit 81 replaces the first induction unit 131 and the second induction unit 132. A second loop unit 82 replaces the third induction unit 133. The first loop unit 81 is disposed to surround the second loop unit 82 in a co-planar manner. The second loop unit 82 is spaced apart from the first loop unit 81 by a first distance d. The distance d influences the coupling parameter K, and the shorter the distance d, the bigger will be the coupling parameter K. Therefore, during the design, the adjustment of the first distance d changes the coupling parameter K to compensate the gain mismatching problem of the single-to-differential conversion circuit.

Figure 7:
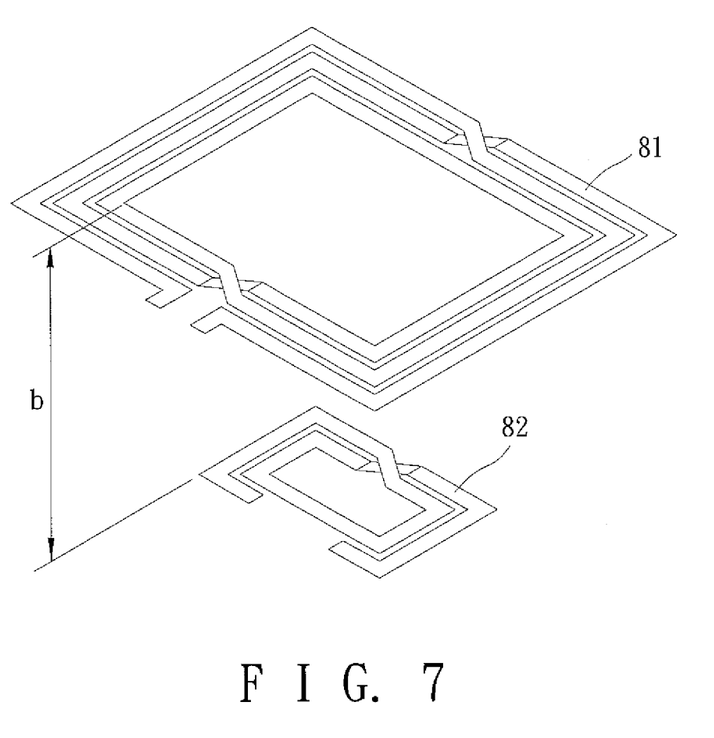
FIG. 7 is yet another alternative implementation of the transforming unit of the preferred embodiment.

Referring to both FIG. 3 and FIG. 7, which is similar to the implementation of FIG. 6, but where the first loop unit 81 is disposed to surround the second loop unit 82 in a non-coplanar manner, the second loop unit 82 is spaced apart from the first loop unit 81 by a second distance b. The distance b influences the coupling parameter K. The shorter the distance b, the bigger will be the coupling parameter K. Therefore, during the design, the adjustment of the second distance b can change the coupling parameter K to compensate the gain mismatching problem of the single-to-differential conversion circuit.

On an extra note, FIG. 5 to FIG. 7 are three derivations of the transforming unit 13 in the single-to-differential conversion circuit when used in different products. The invention is not limited to these embodiments.

Worth noting is that the first induction unit 131 and the third induction unit 133 can also undergo a first electrical coupling according to a first coupling parameter, and the second induction unit 132 and the third induction unit 133 can also undergo a second electrical coupling according to a second coupling parameter. When designing, the first and second coupling parameters can be changed to compensate for the gain mismatching problem of the single-to-differential conversion circuit.

According to the above description, the embodiments can use electrical coupling to compensate a gain mismatching problem in a single-to-differential conversion circuit, thereby achieving the goal of the present invention.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A single-to-differential conversion circuit, comprising:
   a first transistor, having a third terminal to receive an input signal, a second terminal, and a first terminal;
   a second transistor, having a first terminal, a second terminal and a third terminal; and
   a transforming unit, comprising:
   a first induction element, having a first inductive terminal coupled to said second terminal of said first transistor, and a second inductive terminal to be coupled to a voltage source;
   a second induction element, having a first inductive terminal to be coupled to the voltage source, and a second inductive terminal coupled to said second terminal of said second transistor; and
   a third induction element, having a first inductive terminal coupled to said first terminal of said first transistor and said first terminal of said second transistor, and a second inductive terminal to be coupled to ground;

wherein said first induction element and said third induction element undergo a first electrical coupling according to a first coupling parameter, and said second induction element and said third induction element undergo a second electrical coupling according to a second coupling parameter.

2. The single-to-differential conversion circuit as claimed in claim 1, wherein said first inductive terminal of said first induction element outputs a first differential voltage, and said first electrical coupling decreases an absolute value of the magnitude of the first differential voltage.

3. The single-to-differential conversion circuit as claimed in claim 2, wherein said second inductive terminal of said second induction element outputs a second differential voltage, and said second electrical coupling increases an absolute value of the magnitude of the second differential voltage.

4. The single-to-differential conversion circuit as claimed in claim 1, wherein said first inductive terminal of said first induction element outputs a first differential voltage, said second inductive terminal of said second induction element outputs a second differential voltage, and said single-to-differential conversion circuit processes gain compensation through said first electrical coupling and said second electrical coupling.

5. The single-to-differential conversion circuit as claimed in claim 4, wherein said gain compensation makes an absolute value of the first differential voltage substantially equal to an absolute value of the second differential voltage.

6. The single-to-differential conversion circuit as claimed in claim 1, wherein said first induction element and said second induction element are implemented as a first coil unit, said third induction element is implemented as a second coil unit, said first coil unit is disposed to surround said second coil unit, said second coil unit is spaced apart from said first coil unit by a distance, the distance affects the first coupling parameter and the second coupling parameter, and the distance has a negative relation to the first coupling parameter and the second coupling parameter.

7. The single-to-differential conversion circuit as claimed in claim 1, wherein said first induction element and said second induction element are implemented as a first coil unit, said third induction element is implemented as a second coil unit, said first coil unit is disposed to surround said second coil unit in a non-coplanar manner, said second coil unit is spaced apart from said first coil unit by a distance, the distance affects the first coupling parameter and the second coupling parameter, and the distance has a negative relation to the first coupling parameter and the second coupling parameter.

8. The single-to-differential conversion circuit as claimed in claim 1, wherein said first induction element is implemented using a first transmission line section, said second induction element is implemented using a second transmission line section, said third induction element is implemented using a third transmission line section, lengths of said first and second transmission line sections are one eighth of a wavelength of the input signal, and length of said third transmission line section is one quarter of the wavelength of the input signal.

9. A single-to-differential conversion circuit, comprising:
a first transistor, having a third terminal to receive an input signal, a second terminal, and a first terminal;
a second transistor, having a first terminal, a second terminal, and a third terminal; and
a transforming unit, comprising:

a first induction element, having a first inductive terminal coupled to said second terminal of said first transistor, and a second inductive terminal to be coupled to a voltage source;
a second induction element, having a first inductive terminal to be coupled to the voltage source, and a second inductive terminal coupled to said second terminal of said second transistor; and
a third induction element, having a first inductive terminal coupled to said first terminal of said first transistor and said first terminal of said second transistor, and a second inductive terminal to be coupled to ground;
wherein said first induction element and said third induction element undergo a first electrical coupling according to a coupling parameter, and said second induction element and said third induction element undergo a second electrical coupling according to the coupling parameter.

10. The single-to-differential conversion circuit as claimed in claim 9, wherein said first inductive terminal of said first induction element outputs a first differential voltage, and said first electrical coupling decreases an absolute value of the magnitude of the first differential voltage.

11. The single-to-differential conversion circuit as claimed in claim 10, wherein said second inductive terminal of said second induction element outputs a second differential voltage, and said second electrical coupling increases an absolute value of the magnitude of the second differential voltage.

12. The single-to-differential conversion circuit as claimed in claim 9, wherein said first inductive terminal of said first induction element outputs a first differential voltage, said second inductive terminal of said second induction element outputs a second differential voltage, and said single-to-differential conversion circuit processes gain compensation through said first electrical coupling and said second electrical coupling.

13. The single-to-differential conversion circuit as claimed in claim 12, wherein the gain compensation makes the absolute value of said first differential voltage substantially equal to the absolute value of said second differential voltage.

14. The single-to-differential conversion circuit as claimed in claim 9, wherein the coupling parameter (K) is defined as:

$$K = \frac{g_m}{2[g_m + (1-A)Y_{gs1} + (-A)Y_{gs2}] \cdot \sqrt{\frac{2L_3}{L_0}}}$$

in which $g_m$ is a transconductance coefficient of said first and second transistors, A is a matching parameter, $Y_{gs1}$ is an equivalent reactance between said third terminal of said first transistor and said first terminal of said first transistor, $Y_{gs2}$ is an equivalent reactance between said third terminal of said second transistor and said first terminal of said second transistor, $L_3$ is the inductance of said third induction element, and $L_0$ is the inductance of each of said first and second induction elements.

15. The single-to-differential conversion circuit as claimed in claim 14, wherein the matching parameter (A) is defined as $$A = \frac{(g_m + Y_{gs1}) \cdot Z_{L3}}{1 + (2g_m + Y_{gs1} + Y_{gs2}) \cdot Z_{L3}}$$

in which $Z_{L3}$ is an equivalent impedance of said third induction element.

\* \* \* \* \*